US012073906B2

(12) United States Patent
Zhao et al.

(10) Patent No.: US 12,073,906 B2
(45) Date of Patent: Aug. 27, 2024

(54) PACKAGE PIN PATTERN FOR DEVICE-TO-DEVICE CONNECTION

(71) Applicant: Intel Corporation, Santa Clara, CA (US)

(72) Inventors: Chong J. Zhao, West Linn, OR (US); James A. McCall, Portland, OR (US); Robert J. Friar, Portland, OR (US); Yidnekachew S. Mekonnen, Chandler, AZ (US); San K. Chhay, Lacey, WA (US)

(73) Assignee: Intel Corporation, Santa Clara, CA (US)

( * ) Notice: Subject to any disclaimer, the term of this patent is extended or adjusted under 35 U.S.C. 154(b) by 696 days.

(21) Appl. No.: 17/086,220

(22) Filed: Oct. 30, 2020

(65) Prior Publication Data

US 2021/0074333 A1  Mar. 11, 2021

(51) Int. Cl.
| | |
|---|---|
| *H05K 7/00* | (2006.01) |
| *G11C 5/06* | (2006.01) |
| *G11C 8/18* | (2006.01) |
| *H05K 5/02* | (2006.01) |

(52) U.S. Cl.
CPC .................. *G11C 5/06* (2013.01); *G11C 8/18* (2013.01); *H05K 5/0286* (2013.01)

(58) Field of Classification Search
CPC ............... H05K 5/0286; H05K 7/1452; H01R 13/6469; H01R 12/718; H01R 13/6471
See application file for complete search history.

(56) References Cited

U.S. PATENT DOCUMENTS

| | | | | |
|---|---|---|---|---|
| 11,546,983 B2 * | 1/2023 | Gailus | ................. | H05K 3/0047 |
| 11,553,589 B2 * | 1/2023 | Charbonneau | ......... | H05K 1/115 |
| 11,742,601 B2 * | 8/2023 | Cartier, Jr. | ......... | H01R 13/6474 |
| | | | | 439/607.55 |
| 11,917,749 B1 * | 2/2024 | Azeroual | ................ | H01L 23/50 |
| 2007/0155195 A1 | 7/2007 | He et al. | | |

(Continued)

OTHER PUBLICATIONS

International Search Report and Written Opinion for PCT Patent Application No. PCT/US21/51361, Mailed Jan. 5, 2022, 10 pages.

(Continued)

*Primary Examiner* — Phuong Chi Thi Nguyen
(74) *Attorney, Agent, or Firm* — Compass IP Law PC

(57) ABSTRACT

Examples described herein relate to a pattern of pins where the signals assigned to the pins are arranged in a manner to reduce cross-talk. In some examples, a socket substrate includes a first group of pins that includes a first group of data (DQ) pins separated by at least two Voltage Source Supply (VSS) pins from a second group of DQ pins and a third group of DQ pins separated by at least two VSS pins from a fourth group of DQ pins. In some examples, data strobe signal (DQS) pins are positioned in a column between the first and third groups of DQ pins and the second and fourth groups of DQ pins. In some examples, a second group of pins includes a first group of DQ pins separated by at least two VSS pins from a second group of DQ pins and a third group of DQ pins separated by at least two VSS pins from a fourth group of DQ pins. In some examples, the second group of pins, DQS pins are positioned between the first and third groups of DQ pins and the second and fourth groups of DQ pins.

20 Claims, 9 Drawing Sheets

(56) References Cited

U.S. PATENT DOCUMENTS

| | | |
|---|---|---|
| 2011/0019378 A1 | 1/2011 | Aoki et al. |
| 2013/0278348 A1 | 10/2013 | Ye |
| 2017/0005438 A1 | 1/2017 | Benedict et al. |
| 2017/0324208 A1 | 11/2017 | Popovic |
| 2019/0101961 A1 | 4/2019 | Aygun et al. |
| 2020/0066641 A1 | 2/2020 | Aygun et al. |
| 2020/0296852 A1 | 9/2020 | Nekkanty et al. |
| 2021/0074333 A1 | 3/2021 | Zhao et al. |
| 2022/0369452 A1* | 11/2022 | Pritchard ............. H05K 1/0222 |
| 2023/0032371 A1* | 2/2023 | Farkas ................... H05K 1/117 |

OTHER PUBLICATIONS

"Terms, Definitions, and Letter Symbols for Microcomputers, Microprocessors, and Memory Integrated Circuits", JEDEC Standard, JESD100B.01 (Minor Revisoin of JESD100-B, Dec. 1999) Dec. 2002, 62 pages.

Zhao, Richard, "Intel Enterprise Server Processor Packaging Challenge and Future Trend", 2014 15th International Conference on Electronic Packaging Technology, 2014 IEEE, 6 pages.

Extended European Search Report for Patent Application No. 21887139.0, Mailed May 16, 2024, 12ages.

\* cited by examiner

PACKAGE PIN PATTERN FOR DEVICE-TO-DEVICE CONNECTION

As processors continue to increase in performance and throughput, the transmission of data from memory devices to the processor (and vice versa) can create a bottleneck in electronics and computing devices. To increase throughput, wider interfaces have been used to increase the number of signal lines used to send signals between the memory and the processors. However, more signal lines means more pins on connectors, resulting in larger packages, and more power consumption.

DETAILED DESCRIPTION

Double data rate (DDR) data bus technology is prevalent as the communication technology between a main memory controller of a computing system and the computing system's main memory. For example, the Joint Electron Device Engineering Council (JEDEC) publishes DDR data bus standards (e.g., DDR3, DDR4, DDR5, etc.) that have received wide adoption in the computer industry as an interface standard utilized by memory controller designers and memory chip suppliers. See, for example, SDRAM DDRx, where x is a version number and an integer that is 3 or more. See, for example, JESD79-3, JESD79-4, and JESD79-5 that correspond to respective DDR3, DDR4, and DDR5.

DDR provides for various signal traces (also referred to as "nets") including a command signal trace (CMD), data strobe signal traces (DQS and/DQS) and multiple data signal traces (DQ). The bus transfers data (DIN) over the DQ traces in multiple bursts where the data of each burst has different associated memory address information (e.g., A0, A1, A2, A3). The DIN data can be transferred synchronously with a group of data strobe signals (DQS and/DQS) that together form a differential strobe signal, where DQS corresponds to the positive end of the differential signal and/DQS corresponds to the negative end of the differential signal.

Figure 1:
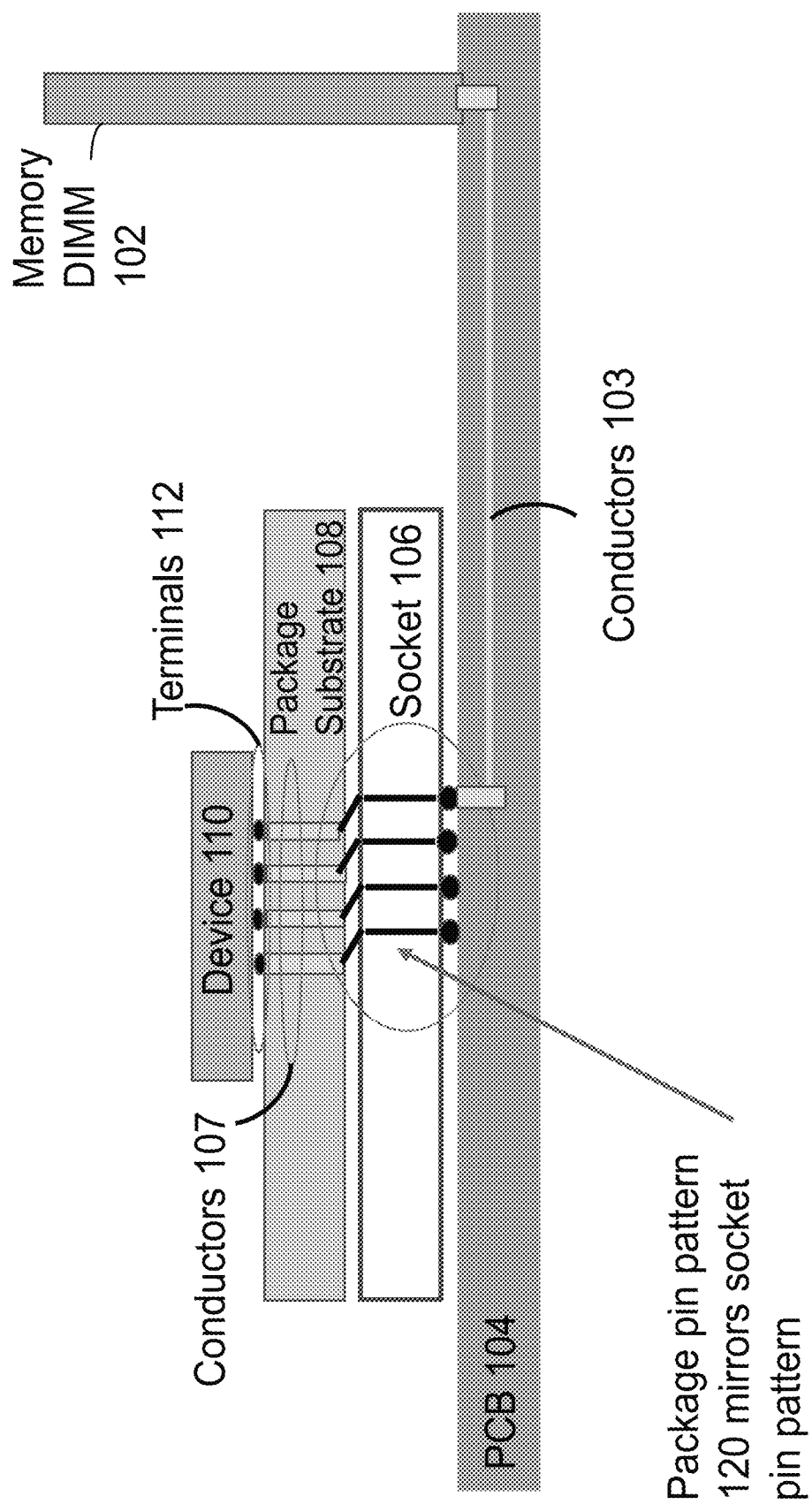
FIG. 1 shows a perspective of a device-to-device connection using a socket pin pattern.

FIG. 1 shows a perspective of a device-to-device connection using a socket pin pattern. A dual in-line memory module (DIMM) 102 can be coupled to device 110 (e.g., processor, central processing unit (CPU), graphics processing unit (GPU), accelerator, memory device or any device) using conductors 103 embedded in a printed circuit board (PCB) 104. The conductors 103 can be conductively coupled to socket pin pattern 120 within socket 106. Socket pin pattern 120 of socket 106 can connect to conductors 107 of a package substrate 108. Conductors 107 of package substrate 108 can connect to terminals 112 of device 110. In some examples, a package pin pattern 120 mirrors a socket pin pattern within socket 106. Examples are not limited to providing device-to-device connection between a DIMM and a device and can instead provide device-to-device signal transmission among any two or more devices.

Figure 2:
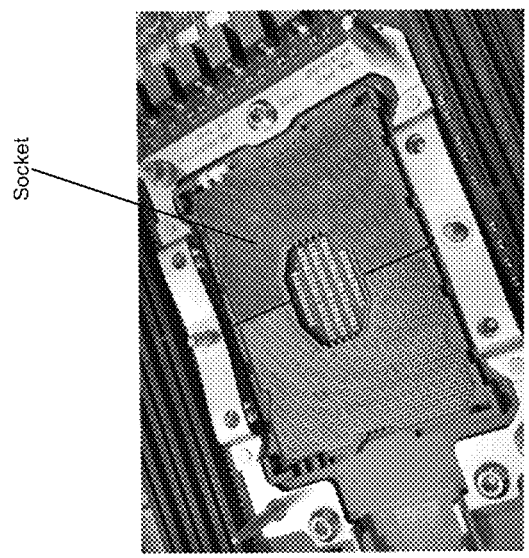
FIG. 2 depicts an example perspective of a socket.

FIG. 2 depicts an example perspective of a socket. A socket can include mechanical components that provide mechanical and electrical connections between a device and a printed circuit board (PCB).

Figure 3:
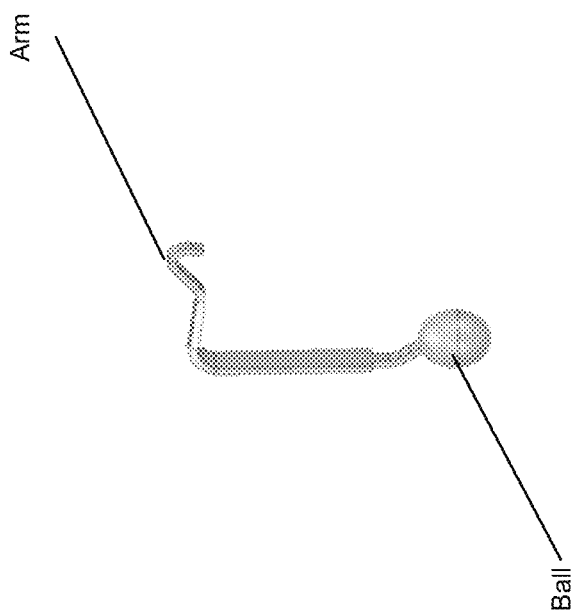
FIG. 3 depicts an example of a single socket pin.

FIG. 3 depicts an example of a single socket pin. In this example, a single socket pin can include a ball portion and an arm portion that provides contact with the package pad or package conductors and flexibility for bending. The ball portion can be connected to a PCB whereas the arm portion can be connected to conductors of a package substrate. A socket pin can be formed of copper or other conductive materials for example.

Figure 4:
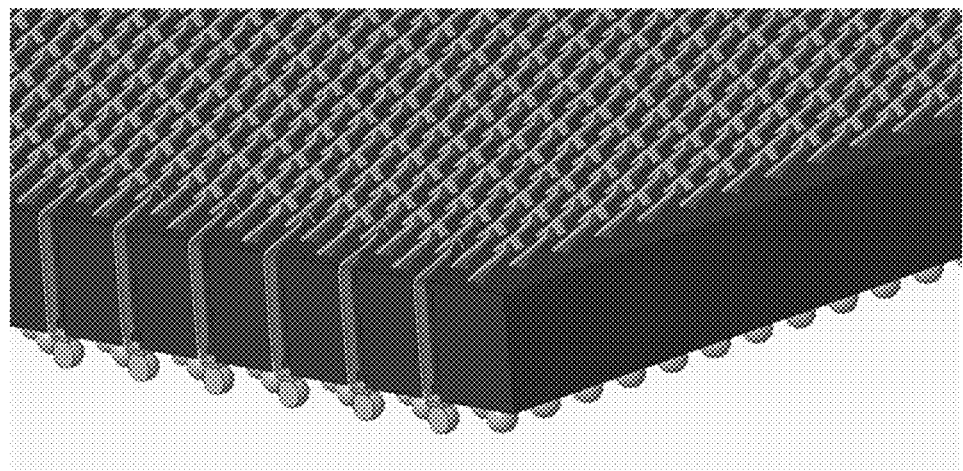
FIG. 4 depicts an example perspective of a socket pin layout positioned within a socket.

FIG. 4 depicts an example perspective of a socket pin layout positioned within a socket. Various layouts of socket pins can be used. A socket can be formed of plastic or other insulator material for example.

Figure 5:
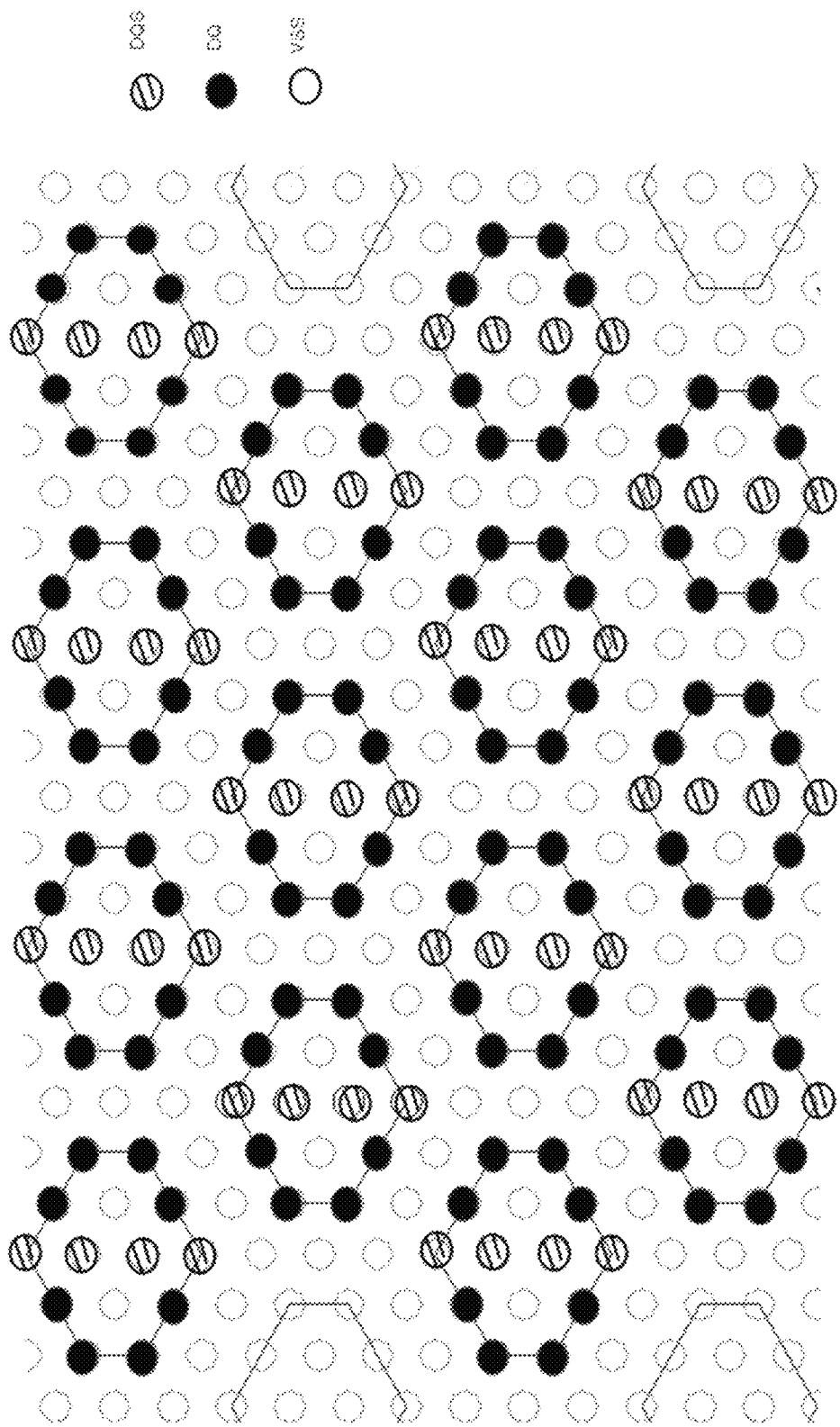
FIG. 5 depicts an example of a top-down view of a package pin map pattern.

FIG. 5 depicts an example of a top-down view of a package pin map pattern. This pattern can be referred to as a "Bowtie" pattern. A DQ pin can represent a data Input/Output pin assigned to convey a data input or data output. A DQS pin can represent a strobe pin assigned carry a differential clock signal during read and write operations. Voltage Source Supply (VSS) can represent a ground pin. For DDRx (where x is an integer), for every byte of data, 8 DQ and 4 DQS pins are used to convey 12 signals. The number of DQ, DQS and VSS pins can vary beyond the examples provided herein.

For example, the pin pattern of FIG. 5 can exhibit two DQ pin aggressors nearby a DQ victim pin. In some cases, cross talk can occur between pins that convey a byte of data. For example, cross talk can represent transfer of signals between pins that interferes with signal transmission on various pins. For example, the worst case DQ pin can experience crosstalk from signals of two nearby aggressor DQ pins. This pattern of pines may exhibit too much crosstalk from package to socket to board interconnect at DDR5 data transmission speeds (e.g., 12.8 giga transfers per second (GT/s) and above). Signal quality and crosstalk can be impacted by the package pin map pattern. Vertical crosstalk through package, socket and motherboard can occur that impairs signal quality. Vertical crosstalk can be related to a vertical crosstalk section through package substrate via, socket pin, PCB through via, etc. A via can be an electrical connection between layers in a physical electronic circuit that goes through the plane of one or more adjacent layers. Vertical crosstalk is different from the crosstalk through horizontal layout as the horizontal layout has ground plane isolation to block the noise coupling.

Various embodiments can potentially reduce vertical crosstalk issue through a package pin map designed to isolate crosstalk among DQ signals. Various embodiments can limit the DQ victim pin to one DQ aggressor pin with only additional 3 more pins per one byte of 12 DDR signals.

Figure 6:
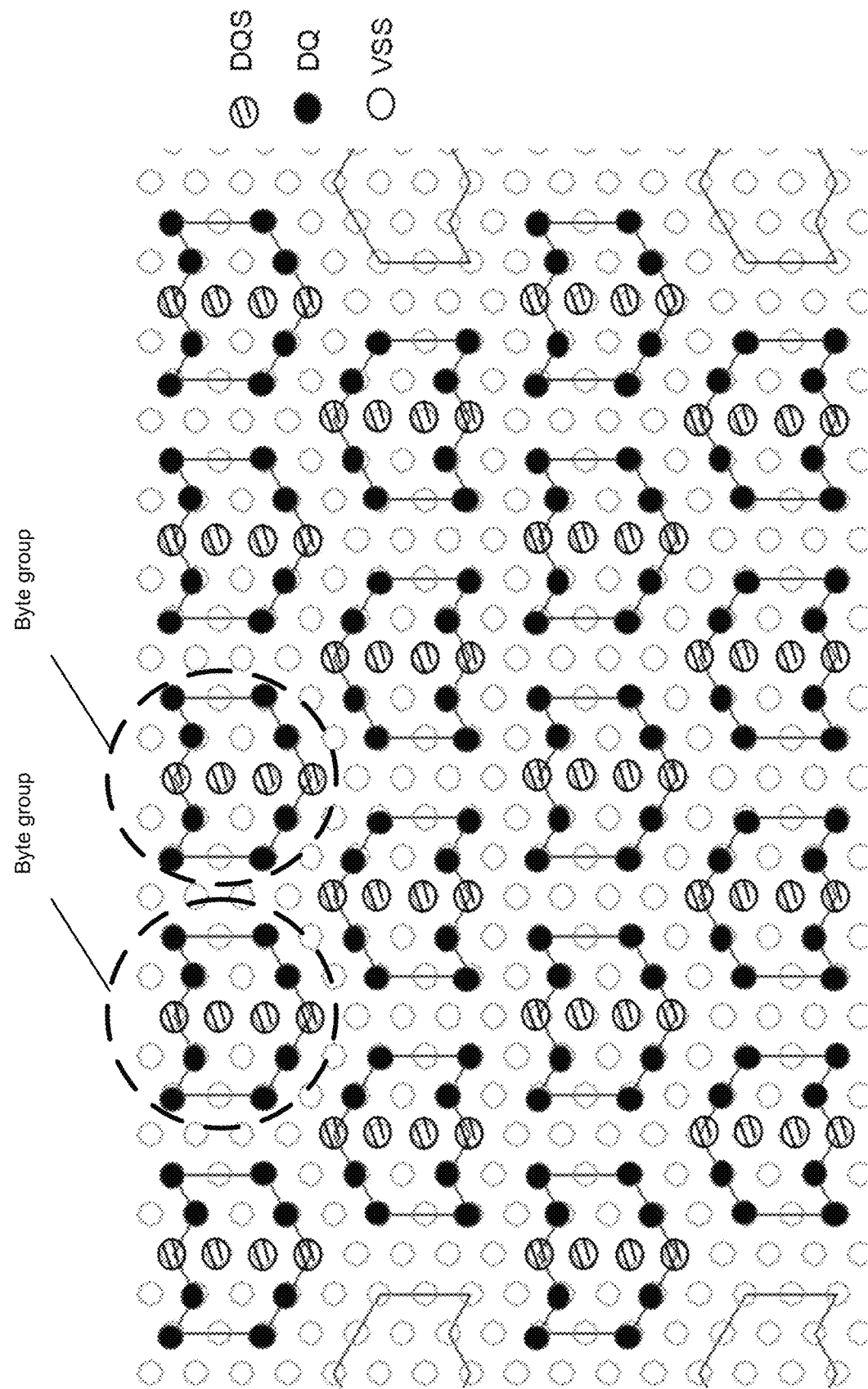
FIG. 6 depicts an example of a top-down view of a package pin map pattern.

FIG. 6 shows an example of byte group pin patterns from a top-down view. In this example, dots represent balls of a pin. An example pin is shown in FIG. 3. In the pattern of FIG. 6, two DQ pins are adjacent and isolated by one or more ground (VSS) pins. Ground (VSS) pins can surround DQ and DQS pins and provide an isolation to reduce crosstalk among signals transferred through DQ pins. For example, each DQ pin may experience crosstalk from one nearby DQ aggressor pin. In some examples, multiple DQS pins can serve as a wall to separate DQ pins of the same byte group.

Various embodiments provide a repeatable pattern that conserves substrate area. In some examples, a pitch can be a distance from center-of-pin to another center-of-pin. A pitch can be 0.94 mm, in some examples.

The pattern of FIG. 6 can provide a bandwidth increase of approximately 15-25% with only a few extra pins in the overall pin field. The package pin map pattern can allow support of DDR5 memory speed of 12.8 GT/s and above with the same interconnect margin. Interconnect margin can be a maximum voltage amplitude of extraneous signal that can be added to the noise-free worst-case input level without causing the output voltage to deviate from the allowable logic voltage level.

By comparison, in the pattern of FIG. 5, signals transmitted on a DQ pin can experience aggressors from two DQ nearby. In the pattern of FIG. 5, 4 DQs are adjacent and isolated by one or more ground pins. The pattern of FIG. 5 has divided DQ into a group of four pins whereas the pattern of FIG. 6 has divided the DQ into group of two pins.

Table 1 shows a simulation comparison of Read and Write between patterns of FIGS. 5 and 6 for a simulation run based on the 10.4 GT/s. A simulation of Read operations shows the pattern of FIG. 6 could provide a 36 mV/4 ps of Epiglottic Width to Epiglottic Height (EW/EH) margin improvement over the pattern of FIG. 5. For high volume Read simulation of a million case (UPM), the pattern of FIG. 6 could provide 29 mV/5 ps of margin improvement over the pattern of FIG. 5. Various embodiments of the pattern of FIG. 6 could enable memory bus performance to a speed target at 12.8 GT and above, or lower speeds.

The results for the margins represent speed bin increases of approximately 10-20% improvement as compared to the pattern of FIG. 5. This improvement can be extended with socket changes to provide 16 Gb/s or more transfer speeds with acceptable signal quality (e.g., eye opening).

Figure 7:
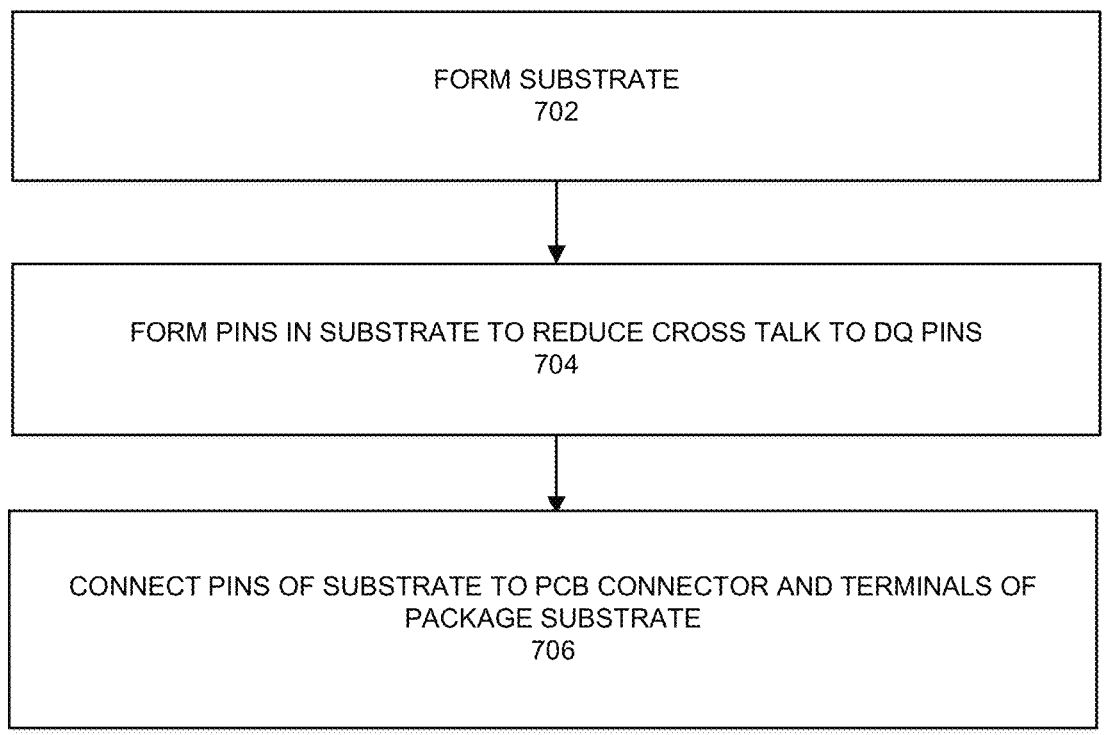
FIG. 7 depicts a process.

FIG. 7 depicts an example process. At 702, a socket substrate is provided. For example, a socket substrate can be formed of a plastic or insulator material. At 704, pins can be formed in a pattern in the socket substrate. For example, the pins can be formed such that two DQ pins are adjacent and isolated by one or more ground (VSS) pins. Ground (VSS) pins can surround DQ and DQS pins and provide an isolation to reduce crosstalk among signals transferred through DQ pins. DQS, DQ, and VSS pins can transfer respective DQS, DQ, and VSS signals. At 706, pins of the substrate can connect to a PCB and terminals of a package substrate.

Figure 8:
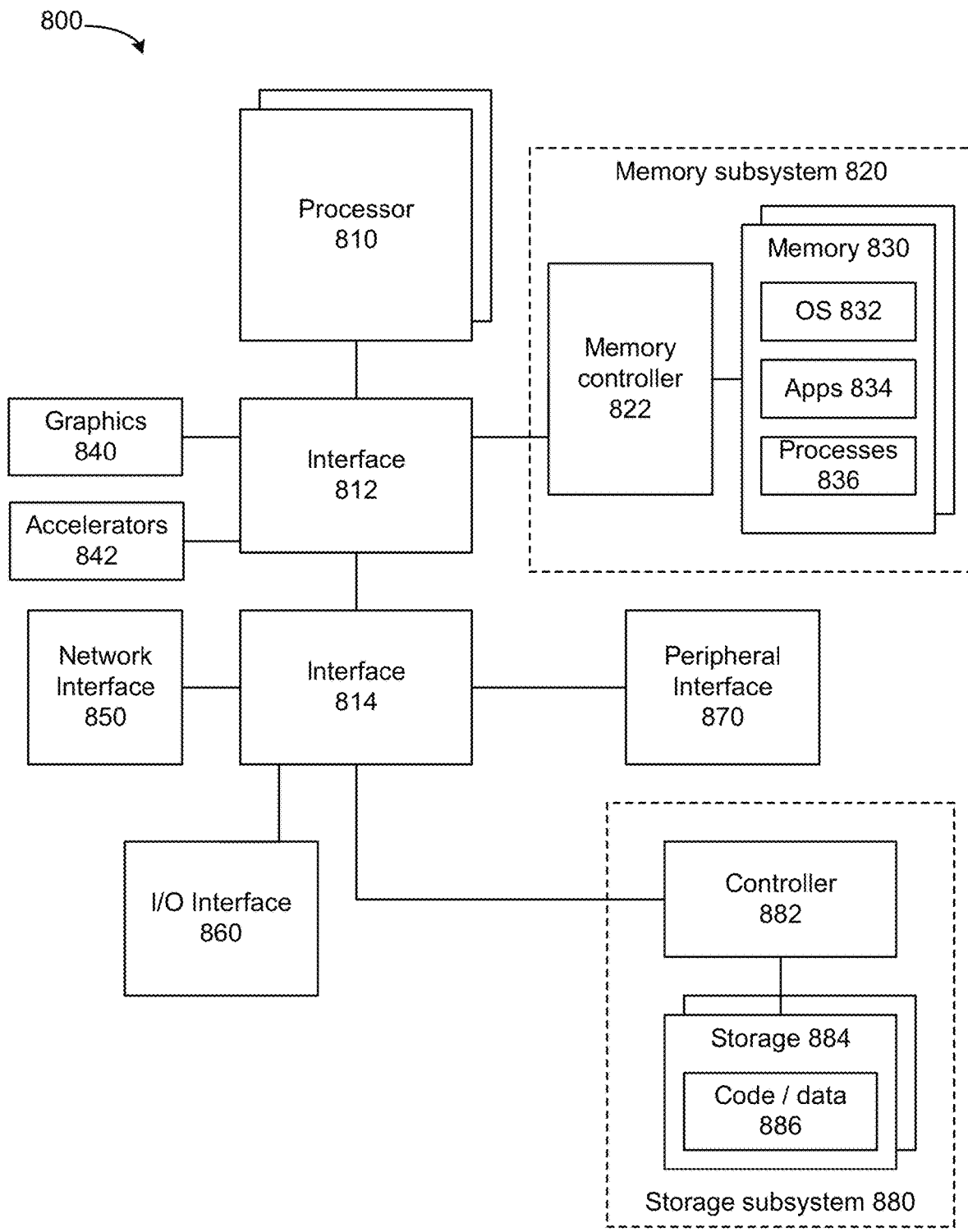
FIG. 8 depicts a system.

FIG. 8 depicts a system. The system can use embodiments described herein with a device-to-device connection using a socket having a pin layout described herein. System 800 includes processor 810, which provides processing, operation management, and execution of instructions for system 800. Processor 810 can include any type of microprocessor, central processing unit (CPU), graphics processing unit (GPU), processing core, or other processing hardware to provide processing for system 800, or a combination of processors. Processor 810 controls the overall operation of system 800, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 800 includes interface 812 coupled to processor 810, which can represent a higher speed interface or a high throughput interface for system components that needs higher bandwidth connections, such as memory subsystem 820 or graphics interface components 840, or accelerators 842. Interface 812 represents an interface circuit, which can be a standalone component or integrated onto a processor die. Where present, graphics interface 840 interfaces to graphics components for providing a visual display to a user of system 800. In one example, graphics interface 840 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 840 generates a display based on data stored in memory 830 or based on operations executed by processor 810 or both. In one example, graphics interface 840 generates a display based on data stored in memory 830 or based on operations executed by processor 810 or both.

Accelerators 842 can be a programmable and/or fixed function offload engine that can be accessed or used by a processor 810 or network interface 850. For example, an

TABLE 1

| | Criteria | Typical Case Margin | UPM % | UPM Margin |
|---|---|---|---|---|
| | Read | | | |
| Bowtie Pattern | | | | |
| | EH at BER e-16 (V) | 0.055 | 0.286 | 0.005 |
| | EW at BER e-16 (ps) | 12 | 0.427 | 1 |
| Various embodiments | | | | |
| | EH at BER e-16 (V) | 0.091 | 0.000 | 0.034 |
| | EW at BER e-16 (ps) | 16 | 0.000 | 6 |
| | Write | | | |
| Bowtie Pattern | | | | |
| | EH at BER e-16 (V) | 0.062 | 0.000 | 0.029 |
| | EW at BER e-16 (ps) | 19 | 0.000 | 11 |
| Various embodiments | | | | |
| | EH at BER e-16 (V) | 0.11 | 0.000 | 0.046 |
| | EW at BER e-16 (ps) | 24 | 0.000 | 14 | accelerator can include one or more offload processors described herein. For example, an accelerator among accelerators 842 can provide compression (DC) capability, cryptography services such as public key encryption (PKE), cipher, hash/authentication capabilities, decryption, or other capabilities or services. In some embodiments, in addition or alternatively, an accelerator among accelerators 842 provides field select controller capabilities as described herein. In some cases, accelerators 842 can be integrated into a CPU socket (e.g., a connector to a motherboard or circuit board that includes a CPU and provides an electrical interface with the CPU). For example, accelerators 842 can include a single or multi-core processor, graphics processing unit, logical execution unit single or multi-level cache, functional units usable to independently execute programs or threads, application specific integrated circuits (ASICs), neural network processors (NNPs), programmable control logic, and programmable processing elements such as field programmable gate arrays (FPGAs). Accelerators 842 can provide multiple neural networks, CPUs, processor cores, general purpose graphics processing units, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 820 represents the main memory of system 800 and provides storage for code to be executed by processor 810, or data values to be used in executing a routine. Memory subsystem 820 can include one or more memory devices 830 such as read-only memory (ROM), flash memory, one or more varieties of random access memory (RAM) such as DRAM, or other memory devices, or a combination of such devices. Memory 830 stores and hosts, among other things, operating system (OS) 832 to provide a software platform for execution of instructions in system 800. Additionally, applications 834 can execute on the software platform of OS 832 from memory 830. Applications 834 represent programs that have their own operational logic to perform execution of one or more functions. Processes 836 represent agents or routines that provide auxiliary functions to OS 832 or one or more applications 834 or a combination. OS 832, applications 834, and processes 836 provide software logic to provide functions for system 800. In one example, memory subsystem 820 includes memory controller 822, which is a memory controller to generate and issue commands to memory 830. It will be understood that memory controller 822 could be a physical part of processor 810 or a physical part of interface 812. For example, memory controller 822 can be an integrated memory controller, integrated onto a circuit with processor 810.

While not specifically illustrated, it will be understood that system 800 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a Hyper Transport or industry standard architecture (ISA) bus, a small computer system interface (SCSI) bus, a universal serial bus (USB), or an Institute of Electrical and Electronics Engineers (IEEE) standard 1394 bus (Firewire).

In one example, system 800 includes interface 814, which can be coupled to interface 812. In one example, interface 814 represents an interface circuit, which can include standalone components and integrated circuitry. In one example, multiple user interface components or peripheral components, or both, couple to interface 814. Network interface 850 provides system 800 the ability to communicate with remote devices (e.g., servers or other computing devices) over one or more networks. Network interface 850 can include an Ethernet adapter, wireless interconnection components, cellular network interconnection components, USB (universal serial bus), or other wired or wireless standards-based or proprietary interfaces. Network interface 850 can transmit data to a device that is in the same data center or rack or a remote device, which can include sending data stored in memory. Network interface 850 can receive data from a remote device, which can include storing received data into memory. Various embodiments can be used in connection with network interface 850, processor 810, and memory subsystem 820.

In one example, system 800 includes one or more input/output (I/O) interface(s) 860. I/O interface 860 can include one or more interface components through which a user interacts with system 800 (e.g., audio, alphanumeric, tactile/touch, or other interfacing). Peripheral interface 870 can include any hardware interface not specifically mentioned above. Peripherals refer generally to devices that connect dependently to system 800. A dependent connection is one where system 800 provides the software platform or hardware platform or both on which operation executes, and with which a user interacts.

In one example, system 800 includes storage subsystem 880 to store data in a nonvolatile manner. In one example, in certain system implementations, at least certain components of storage 880 can overlap with components of memory subsystem 820. Storage subsystem 880 includes storage device(s) 884, which can be or include any conventional medium for storing large amounts of data in a nonvolatile manner, such as one or more magnetic, solid state, or optical based disks, or a combination. Storage 884 holds code or instructions and data 886 in a persistent state (e.g., the value is retained despite interruption of power to system 800). Storage 884 can be generically considered to be a "memory," although memory 830 is typically the executing or operating memory to provide instructions to processor 810. Whereas storage 884 is nonvolatile, memory 830 can include volatile memory (e.g., the value or state of the data is indeterminate if power is interrupted to system 800). In one example, storage subsystem 880 includes controller 882 to interface with storage 884. In one example controller 882 is a physical part of interface 814 or processor 810 or can include circuits or logic in both processor 810 and interface 814.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). Another example of volatile memory includes a cache. A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 800. More specifically, power source typically interfaces to one or multiple power supplies in system 800 to provide power to the components of system 800. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 800 can be implemented using interconnected compute sleds of processors, memories, storages, network interfaces, and other components. High speed interconnects can be used such as PCIe, Ethernet, or optical interconnects (or a combination thereof).

Embodiments herein may be implemented in various types of computing and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning groups of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Figure 9:
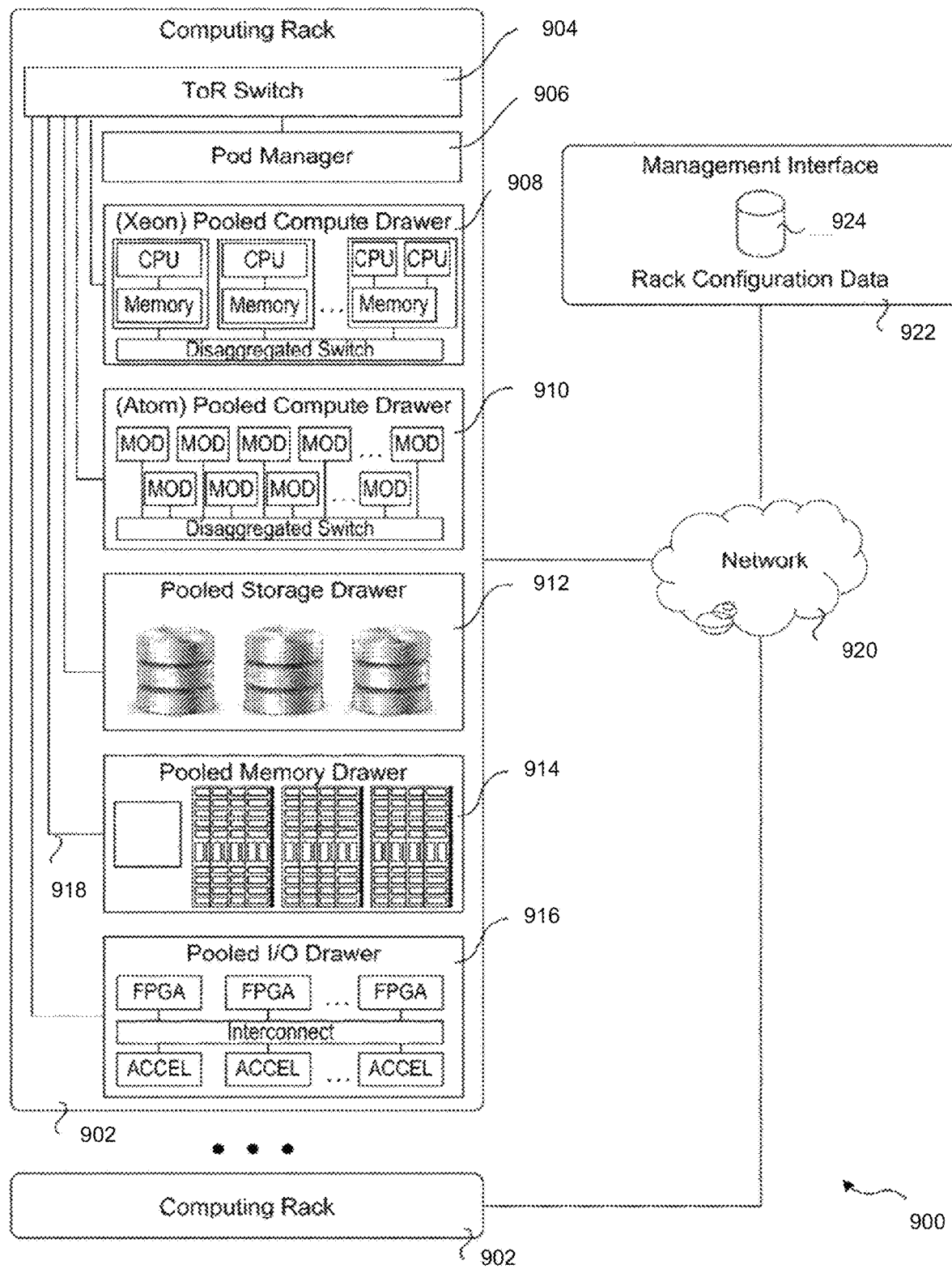
FIG. 9 depicts an example environment.

FIG. 9 depicts an environment 900 that includes multiple computing racks 902, each including a Top of Rack (ToR) switch 904, a pod manager 906, and a plurality of pooled system drawers. The environment can use embodiments described herein with a socket having a pin layout described herein for device-to-device connections. Generally, the pooled system drawers may include pooled compute drawers and pooled storage drawers. Optionally, the pooled system drawers may also include pooled memory drawers and pooled Input/Output (I/O) drawers. In the illustrated embodiment the pooled system drawers include an Intel® XEON® pooled computer drawer 908, and Intel® ATOM™ pooled compute drawer 910, a pooled storage drawer 912, a pooled memory drawer 914, and a pooled I/O drawer 916. Each of the pooled system drawers is connected to ToR switch 904 via a high-speed link 918, such as a 40 Gigabit/ second (Gb/s) or 100 Gb/s Ethernet link or a 100+Gb/s Silicon Photonics (SiPh) optical link. In one embodiment high-speed link 918 comprises an 800 Gb/s SiPh optical link.

Multiple of the computing racks 902 may be interconnected via their ToR switches 904 (e.g., to a pod-level switch or data center switch), as illustrated by connections to a network 920. In some embodiments, groups of computing racks 902 are managed as separate pods via pod manager(s) 906. In one embodiment, a single pod manager is used to manage all of the racks in the pod. Alternatively, distributed pod managers may be used for pod management operations.

Environment 900 further includes a management interface 922 that is used to manage various aspects of the environment. This includes managing rack configuration, with corresponding parameters stored as rack configuration data 924.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip groups, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction groups, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. A processor can be one or more combination of a hardware state machine, digital control logic, central processing unit, or any hardware, firmware and/or software elements.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

Illustrative examples of the devices, systems, and methods disclosed herein are provided below. An embodiment of the devices, systems, and methods may include any one or more, and any combination of, the examples described below.

Example 1 includes any example and includes an apparatus comprising: a socket substrate comprising: a first group of pins comprising: a first group of data (DQ) pins separated by at least two Voltage Source Supply (VSS) pins from a second group of DQ pins and a third group of DQ pins separated by at least two VSS pins from a fourth group of DQ pins.

Example 2 includes any example, wherein data strobe signal (DQS) pins are positioned in a column between the first and third groups of DQ pins and the second and fourth groups of DQ pins.

Example 3 includes any example, and includes a second group of pins comprising: a first group of DQ pins separated by at least two VSS pins from a second group of DQ pins and a third group of DQ pins separated by at least two VSS pins from a fourth group of DQ pins.

Example 4 includes any example, wherein in the second group of pins, DQS pins are positioned between the first and third groups of DQ pins and the second and fourth groups of DQ pins.

Example 5 includes any example, and includes a column of VSS pins to separate the DQ pins of the first group of pins from DQ pins of the second group of pins.

Example 6 includes any example, wherein the socket substrate comprises an insulator material.

Example 7 includes any example, wherein the pins comprises an electrically conductive material.

Example 8 includes any example, wherein a pitch between pins comprises 0.94 mm.

Example 9 includes any example, and includes a printed circuit board (PCB) with a conductor coupled to at least one pin of the socket substrate and a package substrate with a conductor coupled to at least one pin of the socket substrate.

Example 10 includes any example, and includes a first device coupled to the package substrate and a second device coupled to the PCB, wherein at least one pin of the socket substrate provides communicative coupling between the first device and the second device.

Example 11 includes any example, and includes an apparatus comprising: a socket comprising: a first group of pins comprising: data (DQ) pins; data strobe signal (DQS) pins; and Voltage Source Supply (VSS) pins, wherein the DQ pins are positioned into a first group of two DQ pins, a second group of two DQ pins, a third group of two DQ pins, and a fourth group of two DQ pins, wherein at least two DQS pins separate the first and third groups of DQ pins and at least two DQS pins separate the second and fourth groups of DQ pins.

Example 12 includes any example, wherein the DQS pins are arranged in a column.

Example 13 includes any example, wherein the first and third groups of DQ pins are arranged in parallel on one side of the DQS pins and the second and fourth groups of DQ pins are arranged in on another side of the DQS pins.

Example 14 includes any example, wherein the socket comprises a second group of pins separated from the first group of pins by a column of VSS pins.

Example 15 includes any example, wherein the second group of pins comprise: DQ pins are positioned into a first group of two DQ pins, a second group of two DQ pins, a third group of two DQ pins, and a fourth group of two DQ pins, wherein at least two DQS pins separate the first and third groups of DQ pins and at least two DQS pins separate the second and fourth groups of DQ pins.

Example 16 includes any example, wherein the DQS pins of the second group of pins are arranged in a column.

Example 17 includes any example, and includes a method of forming a socket comprising: forming a substrate and forming a pattern of pins in the substrate, wherein the pattern of pins comprise: data (DQ) pins; data strobe signal (DQS) pins; and Voltage Source Supply (VSS) pins, wherein the DQ pins are positioned into a first group of two DQ pins, a second group of two DQ pins, a third group of two DQ pins, and a fourth group of two DQ pins, wherein at least two DQS pins separate the first and third groups of DQ pins and at least two DQS pins separate the second and fourth groups of DQ pins.

Example 18 includes any example, wherein the substrate comprises one or more of: plastic or insulator material.

Example 19 includes any example, wherein the DQS pins are arranged in a column.

Example 20 includes any example, wherein the first and third groups of DQ pins are arranged in parallel on one side of the DQS pins and the second and fourth groups of DQ pins are arranged in on another side of the DQS pins.

What is claimed is:

1. An apparatus comprising:
a socket substrate comprising:
a first group of pins comprising:
a first group of data (DQ) pins separated by at least two Voltage Source Supply (VSS) pins from a second group of DQ pins and
a third group of DQ pins separated by at least two VSS pins from a fourth group of DQ pins.

2. The apparatus of claim 1, wherein the socket substrate comprises: data strobe signal (DQS) pins positioned in a column between the first and third groups of DQ pins and the second and fourth groups of DQ pins.

3. The apparatus of claim 1, wherein the socket substrate comprises an insulator material.

4. The apparatus of claim 1, wherein the pins comprises an electrically conductive material.

5. The apparatus of claim 1, wherein a pitch between at least two pins comprises 0.94 mm.

6. The apparatus of claim 1, comprising:
a printed circuit board (PCB) with a conductor coupled to at least one pin of the socket substrate and
a package substrate with a conductor coupled to at least one pin of the socket substrate.

7. The apparatus of claim 6, comprising:
a first device coupled to the package substrate and
a second device coupled to the PCB, wherein at least one pin of the socket substrate provides communicative coupling between the first device and the second device.

8. The apparatus of claim 1, wherein the socket substrate comprises:
a second group of pins comprising:
a first group of DQ pins separated by at least two VSS pins from a second group of DQ pins and
a third group of DQ pins separated by at least two VSS pins from a fourth group of DQ pins.

9. The apparatus of claim 8, wherein in the second group of pins, DQS pins are positioned between the first and third groups of DQ pins and the second and fourth groups of DQ pins.

10. The apparatus of claim 8, the socket substrate comprises: a column of VSS pins to separate the DQ pins of the first group of pins from DQ pins of the second group of pins.

11. An apparatus comprising:
a socket comprising:
a first group of pins comprising:
data (DQ) pins;
data strobe signal (DQS) pins; and
Voltage Source Supply (VSS) pins, wherein the DQ pins are positioned into a first group of two DQ pins, a second group of two DQ pins, a third group of two DQ pins, and a fourth group of two DQ pins, wherein at least two of the DQS pins separate the first and third groups of DQ pins and at least two of the DQS pins separate the second and fourth groups of DQ pins.

12. The apparatus of claim 11, wherein the DQS pins are arranged in a column.

13. The apparatus of claim 12, wherein the first and third groups of two DQ pins are arranged in parallel on one side of the DQS pins and the second and fourth groups of two DQ pins are arranged in on another side of the DQS pins.

14. The apparatus of claim 12, wherein the socket comprises a second group of pins separated from the first group of pins by a column of VSS pins.

15. The apparatus of claim 14, wherein the second group of pins comprise:
DQ pins are positioned into a first group of two DQ pins, a second group of two DQ pins, a third group of two DQ pins, and a fourth group of two DQ pins, wherein at least two DQS pins separate the first and third groups of DQ pins and at least two DQS pins separate the second and fourth groups of DQ pins.

16. The apparatus of claim 15, wherein the DQS pins of the second group of pins are arranged in a column.

17. A method of forming a socket comprising:
forming a substrate and
forming a pattern of pins in the substrate, wherein the pattern of pins comprise:
data (DQ) pins;
data strobe signal (DQS) pins; and
Voltage Source Supply (VSS) pins, wherein the DQ pins are positioned into a first group of two DQ pins, a second group of two DQ pins, a third group of two DQ pins, and a fourth group of two DQ pins, wherein at least two DQS pins separate the first and third groups of DQ pins and at least two DQS pins separate the second and fourth groups of DQ pins.

18. The method of claim 17, wherein the substrate comprises one or more of: plastic or insulator material.

19. The method of claim 17, wherein the DQS pins are arranged in a column.

20. The method of claim 19, wherein
the first and third groups of DQ pins are arranged in parallel on one side of the DQS pins and the second and fourth groups of DQ pins are arranged in on another side of the DQS pins.

* * * * *